(12) United States Patent
Wu et al.

(10) Patent No.: US 11,871,507 B2
(45) Date of Patent: Jan. 9, 2024

(54) ELECTRONIC DEVICE

(71) Applicant: PEGATRON CORPORATION, Taipei (TW)

(72) Inventors: Chien-Yi Wu, Taipei (TW); Chao-Hsu Wu, Taipei (TW); Cheng-Jui Huang, Taipei (TW); Hao-Hsiang Yang, Taipei (TW); Shih-Keng Huang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 329 days.

(21) Appl. No.: 17/483,544

(22) Filed: Sep. 23, 2021

(65) Prior Publication Data
US 2022/0167494 A1     May 26, 2022

(30) Foreign Application Priority Data
Nov. 24, 2020   (TW) .................................. 109141046

(51) Int. Cl.
*H05K 1/02*     (2006.01)
*H01Q 1/40*     (2006.01)
(Continued)

(52) U.S. Cl.
CPC ............. *H05K 1/0243* (2013.01); *H01Q 1/48* (2013.01); *H01Q 5/307* (2015.01)

(58) Field of Classification Search
CPC .......... H05K 1/02; H05K 1/0243; H01Q 1/40; H01Q 1/44; H01Q 1/48; H01Q 1/50;
(Continued)

(56) References Cited

U.S. PATENT DOCUMENTS 10,116,346 B2 * 10/2018 Kim ........................ H01Q 5/378
10,367,252 B2    7/2019 Ehman et al.
(Continued)

FOREIGN PATENT DOCUMENTS

CN   210200942   3/2020
CN   111193098   5/2020
(Continued)

OTHER PUBLICATIONS

"Office Action of Taiwan Counterpart Application", dated Oct. 27, 2021, p. 1-p. 5.
(Continued)

*Primary Examiner* — Xiaoliang Chen
(74) *Attorney, Agent, or Firm* — J.C. PATENTS

(57) ABSTRACT

An electronic device includes a casing, a circuit board and at least one antenna module. The casing has an accommodating space and an inner side wall surrounding the accommodating space. The circuit board is disposed in the accommodating space. Each of the antenna modules includes a first radiator and a second radiator. The first radiator is disposed on the circuit board and adjacent to the inner side wall, and includes a first section, a second section and a third section extending from the first section in opposite directions respectively. The first section includes a feeding end, and the third section includes a grounding end. The second radiator is disposed on the inner side wall. A coupling gap is formed between the first radiator and the second radiator.

10 Claims, 7 Drawing Sheets

(51) Int. Cl.
*H01Q 1/44* (2006.01)
*H01Q 1/48* (2006.01)
*H01Q 1/50* (2006.01)
*H01Q 5/10* (2015.01)
*H01Q 5/20* (2015.01)
*H01Q 5/28* (2015.01)
*H01Q 5/35* (2015.01)
*H01Q 5/50* (2015.01)
*H01Q 5/307* (2015.01)
*H01Q 5/335* (2015.01)
*H01Q 5/371* (2015.01)
*H01Q 5/378* (2015.01)
*H01Q 9/42* (2006.01)
*H01Q 9/14* (2006.01)

(58) Field of Classification Search
CPC ........ H01Q 1/241; H01Q 1/243; H01Q 1/245; H01Q 1/273; H01Q 1/362; H01Q 1/523; H01Q 1/525; H01Q 1/2291; H01Q 5/10; H01Q 5/20; H01Q 5/28; H01Q 5/35; H01Q 5/50; H01Q 5/307; H01Q 5/335; H01Q 5/371; H01Q 5/378; H01Q 9/42; H01Q 9/0421; H01Q 9/0407; H01Q 9/14
USPC ................. 361/760; 343/702, 873, 848, 893
See application file for complete search history.

(56) References Cited

U.S. PATENT DOCUMENTS

| | | | |
|---|---|---|---|
| 2016/0056545 A1* | 2/2016 | Park | H01Q 9/42 |
| | | | 343/893 |
| 2018/0198192 A1* | 7/2018 | Wu | H01Q 1/273 |
| 2020/0350682 A1* | 11/2020 | Kim | H01Q 1/40 |
| 2021/0151856 A1* | 5/2021 | Kim | H04M 1/0277 |
| 2022/0329677 A1* | 10/2022 | Wu | C08J 5/043 |
| 2022/0345552 A1* | 10/2022 | Wu | H01M 50/247 |

FOREIGN PATENT DOCUMENTS

| | | |
|---|---|---|
| CN | 111916887 | 11/2020 |
| TW | I349395 | 9/2011 |
| TW | 201724646 | 7/2017 |
| TW | I628856 | 7/2018 |
| TW | I635654 | 9/2018 |

OTHER PUBLICATIONS

"Office Action of Taiwan Counterpart Application", dated Sep. 23, 2022, p. 1-p. 6.

* cited by examiner

ELECTRONIC DEVICE

CROSS-REFERENCE TO RELATED APPLICATION

This application claims the priority benefit of Taiwanese application serial no. 109141046, filed on Nov. 24, 2020. The entirety of the above-mentioned patent application is hereby incorporated by reference herein and made a part of this specification.

BACKGROUND

Technical Field

This disclosure relates to an electronic device, in particular to an electronic device having a dual band antenna module.

Description of Related Art

Generally speaking, a wearable electronic device is limited by its small size, and the ground plane on the circuit board is also small. The casing of the wearable electronic device also contains batteries, vibrators, touch units, charging pogo pins, and other elements, making the space available for antenna configuration in the wearable electronic device insufficient and making it difficult to achieve good performance in antenna efficiency.

SUMMARY

The disclosure provides an electronic device having a dual band antenna module.

The electronic device of the disclosure includes a casing, a circuit board, and at least one antenna module. The casing has an accommodating space and an inner side wall surrounding the accommodating space. The circuit board is disposed in the accommodating space. Each of the antenna modules includes a first radiator and a second radiator. The first radiator is disposed on the circuit board and adjacent to the inner side wall. The first radiator includes a first section, a second section and a third section extending from the first section in opposite directions respectively. The first section includes a feeding end, and the third section includes a grounding end. The second radiator is disposed on the inner side wall and is configured at a side of the first radiator. A coupling gap is formed between the first radiator and the first radiator. The first radiator and the second radiator jointly resonate at a first frequency band and a second frequency band.

Based on the above, the first radiator of the antenna module of the disclosure includes the first section, the second section and the third section extending from the first section in opposite directions respectively. The first section includes the feeding end, and the third section includes the grounding end. The second radiator is vertically configured on one side of the first radiator, and the coupling gap is formed between the second radiator and the first radiator. Through the above configuration, the antenna module of the disclosure enables the first radiator and the second radiator to jointly resonate at the first frequency band and the second frequency band, and has a good antenna efficiency performance. In addition, the electronic device of the disclosure provides a dual band function by disposing the first radiator on the circuit board and near an edge of the circuit board, and the second radiator on the inner side wall of the casing, and configuring the antenna module in a limited space.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
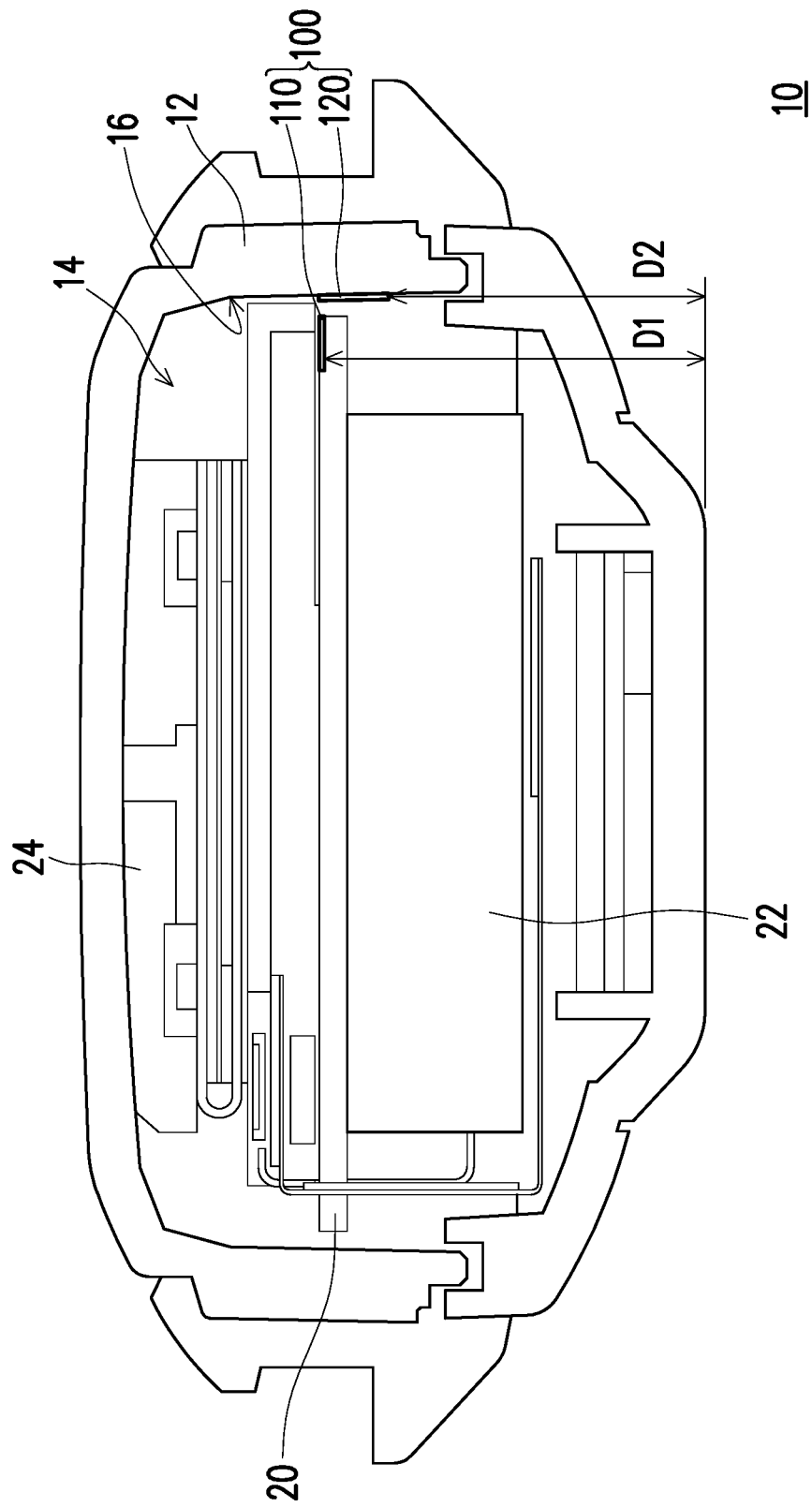
FIG. 1 is a schematic cross-sectional view of a wearable electronic device according to an embodiment of the disclosure.

FIG. 1 is a schematic cross-sectional view of a wearable electronic device according to an embodiment of the disclosure. Referring to FIG. 1, in this embodiment, a wearable electronic device 10 is, for example, a body of a watch, but in other embodiments, the wearable electronic device 10 may also be other devices such as a necklace pendant, and the types of the wearable electronic device 10 are not limited thereto. In this embodiment, an overall physical size of the wearable electronic device 10 may be 34.6 mm in length, 25 mm in width, and 13.1 mm in height, which is a small-sized electronic device.

The wearable electronic device 10 includes a casing 12, a circuit board 20 and an antenna module 100. The casing 12 has an accommodating space 14 and an inner side wall 16 surrounding the accommodating space 14. The circuit board 20 is disposed in the accommodating space 14 of the casing 12. A size of the circuit board 20 is, for example, 30 mm in length, 19.2 mm in width, and 0.6 mm in height. The circuit board 20 is provided with a system ground plane.

The wearable electronic device 10 may optionally include a battery 22 and a touch unit 24, which are electrically connected to the circuit board 20. As shown in FIG. 1, the circuit board 20 is located in a center of the accommodating space 14, and the battery 22 is configured under the circuit board 20. The touch unit 24 is, for example, used to sense fingerprints and is configured above the circuit board 20 near left side.

The antenna module 100 includes a first radiator 110 and a second radiator 120. The first radiator 110 is disposed on the circuit board 20 and near a right edge of the circuit board 20. The second radiator 120 is disposed on the inner side wall 16 of the casing 12, and is configured on one side of the first radiator 110.

In this embodiment, a distance D1 from the first radiator 110 to a bottom of the casing 12 is between 7 mm and 10 mm, for example, 8 mm. A distance D2 from the second radiator 120 to the bottom of the casing 12 is between 5 mm and 6 mm, for example, 5.5 mm. When the wearable electronic device 10 is worn on a human body (for example, an arm), the bottom of the casing 12 is in contact with the human body, and the first radiator 110 and the second radiator 120 are still at a certain distance from the human body, so that antenna efficiency of the antenna module 100 is less affected by the human body and may maintain good performance. Of course, the antenna module 100 of this embodiment may also be configured in a non-wearable electronic device.

A distance between the first radiator 110 and the battery 22 is about 1 mm. The first radiator 110 is quite close to the battery 22, but a signal radiated by the first radiator 110 is not be interfered by the battery 22.

Figure 2:
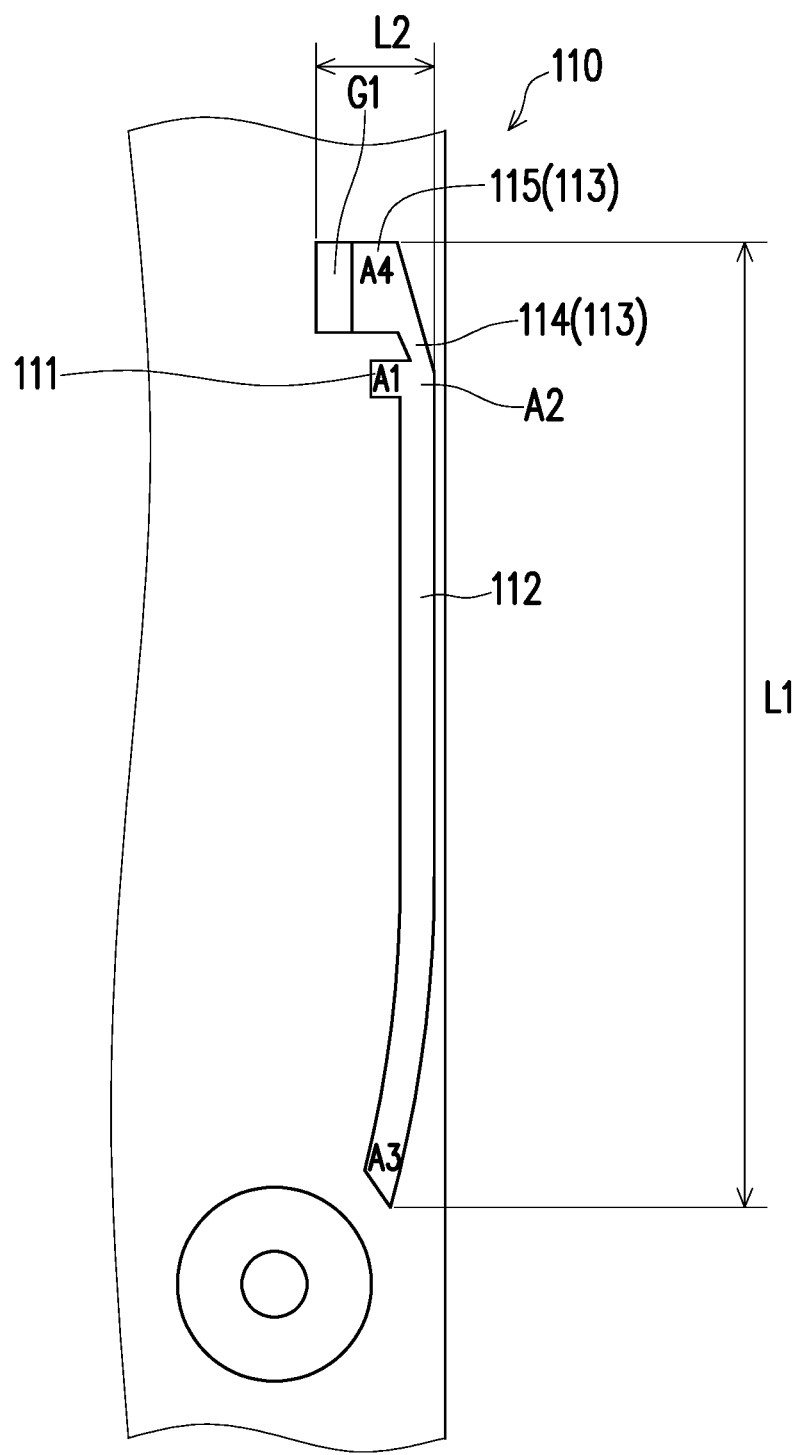
FIG. 2 is a schematic top view of a first radiator of an antenna module of the wearable electronic device of FIG. 1.

FIG. 2 is a schematic top view of a first radiator of an antenna module of the wearable electronic device of FIG. 1. Referring to FIG. 2, in this embodiment, the first radiator 110 includes a first section 111 (positions A1 and A2), a second section 112 (positions A2 and A3) and a third section 113 (positions A2 and A4) extending from the first section 111 in opposite directions respectively. The first section 111 includes a feeding end (position A1), and the third section 113 includes a grounding end (position G1). The third section 113 has a first part 114 and a second part 115 connected by bending. The first part 114 is connected to the second section 112, and the second part 115 is parallel to the first section 111 and forms an F-shape. A length L1 of the first radiator 110 is 15 mm, and a length L2 of the first radiator 110 in another direction is about 1.1 mm to 1.5 mm, which is a small-sized radiator.

In addition, since the first radiator 110 is disposed at an edge of the circuit board 20, a distance between the grounding end (position G1) and the edge of the circuit board 20 is also close to the length L2, and is about 1.1 mm to 1.5 mm.

Figure 3A:
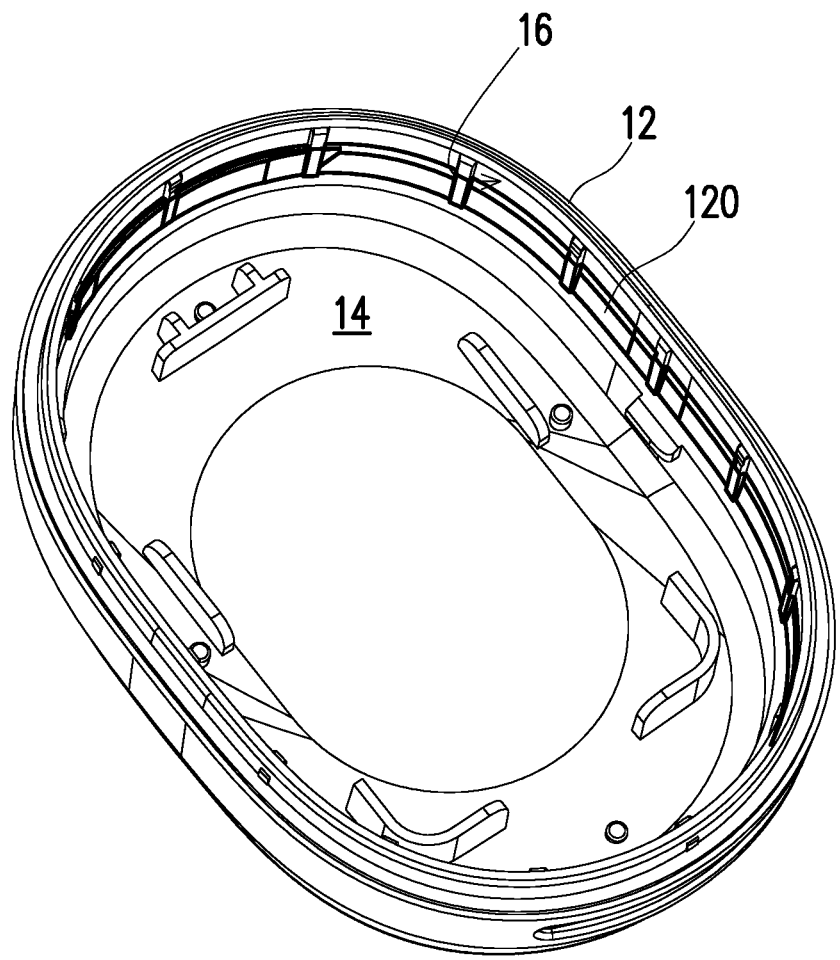
FIG. 3A is a schematic three-dimensional view of a casing and a second radiator of the wearable electronic device of FIG. 1.
Figure 3B:
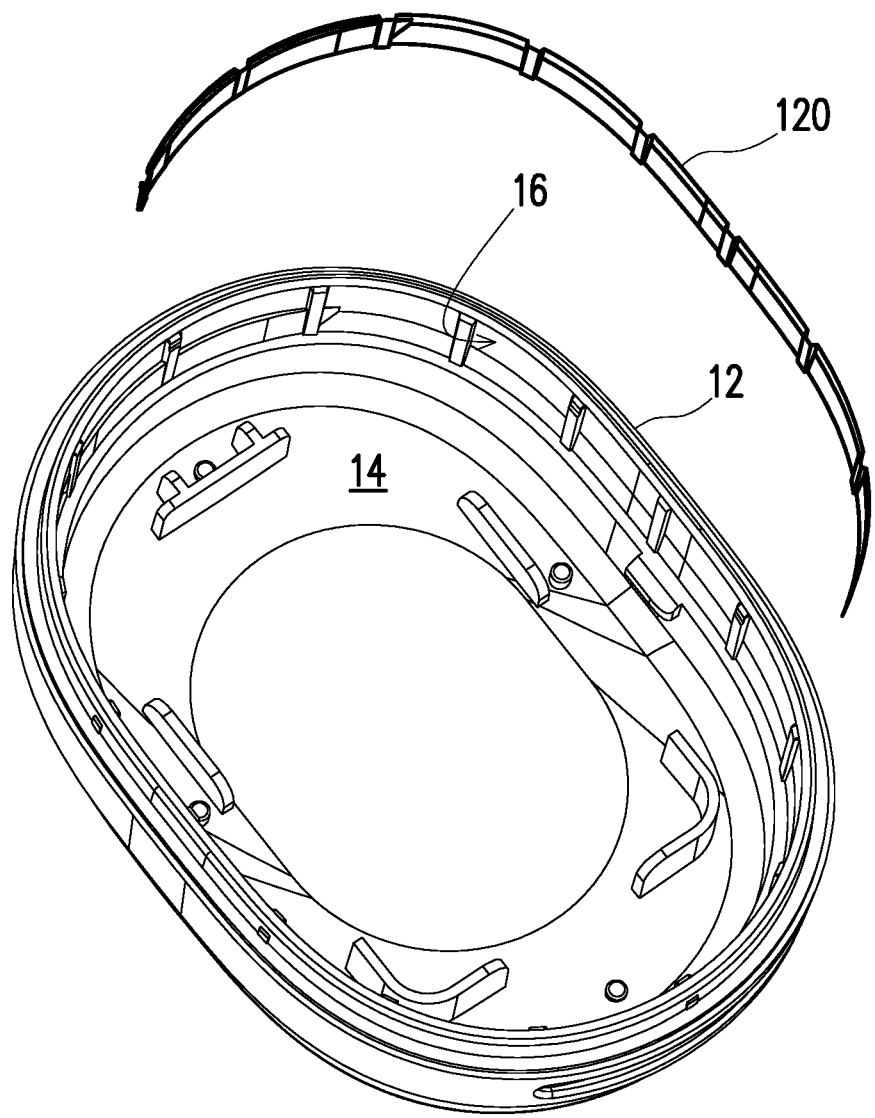
FIG. 3B is a schematic exploded view of FIG. 3A.

FIG. 3A is a schematic three-dimensional view of a casing and a second radiator of the wearable electronic device of FIG. 1. FIG. 3B is a schematic exploded view of FIG. 3A. Referring to FIG. 3A and FIG. 3B, in this embodiment, the second radiator 120 is disposed on the inner side wall 16 of the casing 12. The second radiator 120 may be fabricated using laser direct structuring (LDS), or, alternatively, may be formed by attaching copper foil or aluminum foil to the inner side wall 16 of the casing 12. Since the second radiator 120 is directly attached to the inner side wall 16 of the casing 12, it takes up almost no space, allowing more space for other elements to be disposed in the small-sized wearable electronic device 10.

Figure 4A:
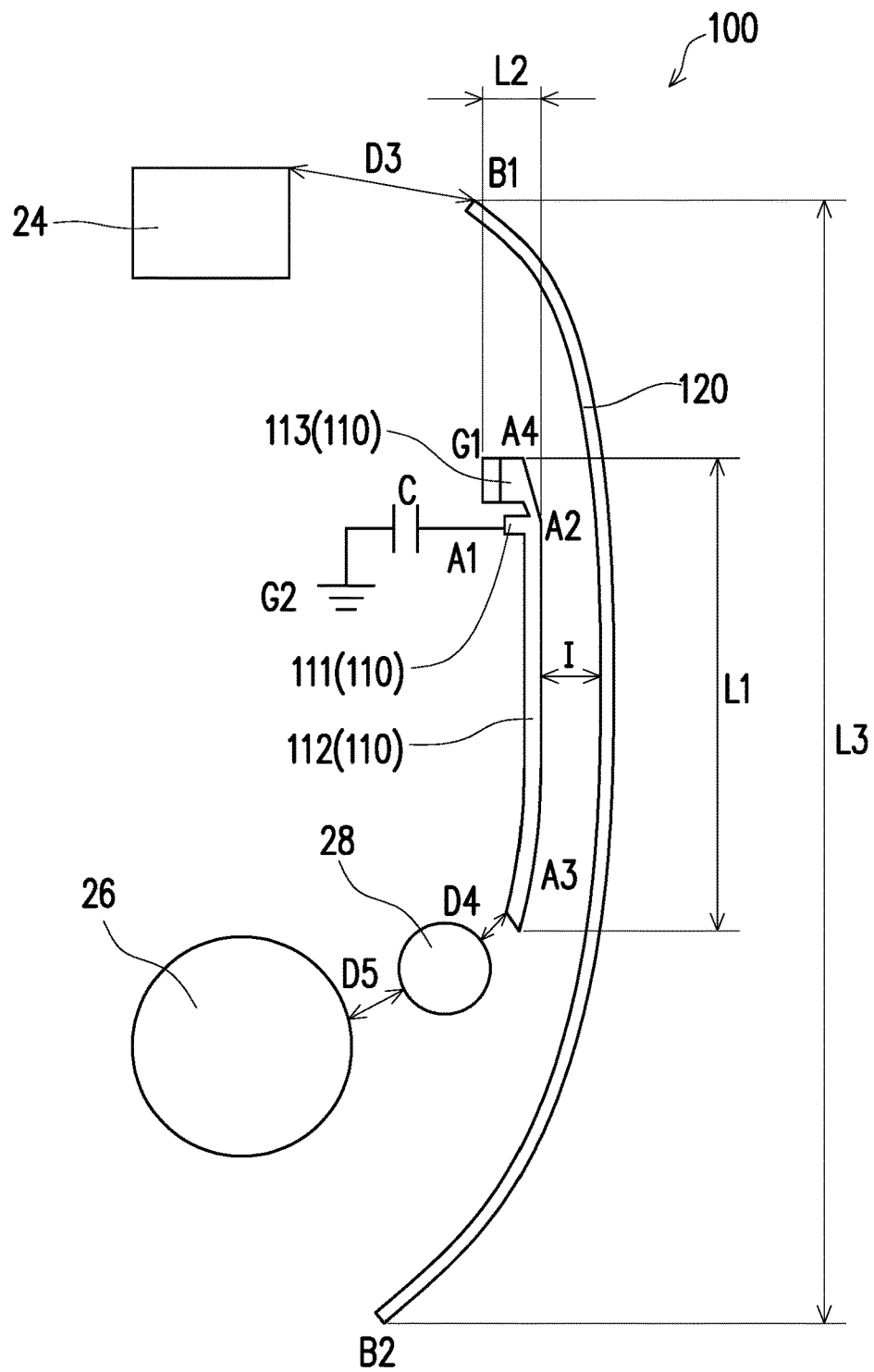
FIG. 4A is a schematic top view of the antenna module and a part of electronic elements of the wearable electronic device of FIG. 1.

FIG. 4A is a schematic top view of the antenna module and a part of electronic elements of the wearable electronic device of FIG. 1. Referring to FIG. 4A, in this embodiment, the feeding end (position A1) of the first radiator 110 may be connected to a wireless signal processing unit (not shown) on the circuit board 20, and the grounding end (position G1) may be connected to a system ground plane (position G2) on the circuit board 20.

The second radiator 120 is vertically disposed on one side of the first radiator 110 without occupying too much plane space.

In addition, in conventional antenna architecture, the circuit board and the radiator not on the circuit board often use elastic pieces to contact each other to conduct, but the size of the elastic pieces is at least 2 mm. In the case of limited space, the element configuration is more tight. In this embodiment, a coupling gap I is formed between the second radiator 120 and the first radiator 110, and the coupling gap I is between 0.5 mm and 1.5 mm, for example, 1 mm. The first radiator 110 on the circuit board 20 is coupled between the second radiator 120 outside of the circuit board 20, allowing more space for other elements to be disposed by omitting the elastic pieces. In this embodiment, the first radiator 110 and the second radiator 120 jointly resonate at a first frequency band and a second frequency band. The first frequency band is between 2400 MHz and 2500 MHz, and the second frequency band is between 3300 MHz and 3600 MHz. The first frequency band is, for example, frequency band of Wi-Fi 2.4G or Bluetooth (BT), and the second frequency band is, for example, FR1 frequency band of 5G. In this embodiment, a length L3 of the second radiator 120 is between ¼ wavelength and ⅜ wavelength of the first frequency band, for example, between 13 mm and 18 mm.

It should be noted that when only the first radiator 110 is provided without the second radiator 120, resonance frequency band of the first radiator 110 is between 3100 MHz and 3200 MHz. The first radiator 110 may resonate at 2400 MHz to 2500 MHz and 3300 MHz to 3600 MHz frequency band by coupling with the second radiator 120. In other words, the antenna module 100 adjusts resonant frequency band through the second radiator 120 to reach the frequency band of Wi-Fi 2.4G or Bluetooth (BT).

In addition, the antenna module 100 further includes a capacitor C (for example, 2.7 pF). The feeding end (position A1) is connected to the system ground plane G2 through the capacitor C, which helps to improve antenna performance in the first frequency band. As a result, even though the size of the wearable electronic device 10 is quite small, the wearable electronic device 10 still performs well in the frequency band of Wi-Fi 2.4G or Bluetooth (BT).

In addition, in this embodiment, a gap between the positions A1 and G1 and a width of the grounding end (position G1) may be used to adjust impedance matching of the first frequency band.

It should be noted that, in this embodiment, a distance D3 between the position B1 of the second radiator 120 and the touch unit 24 is about 3 mm to 5 mm, for example, 4 mm. A distance D4 between the position A3 of the first radiator 110 and a screw 28 is about 1 mm to 2 mm, for example, 1.5 mm. A distance D5 between the screw 28 and a vibrator 26 is about 0.5 mm to 1.5 mm, for example, 1 mm. Although the first radiator 110 and the second radiator 120 are quite close to these elements, signals radiated by the first radiator 110 and the second radiator 120 are not interfered by these elements.

Figure 4B:
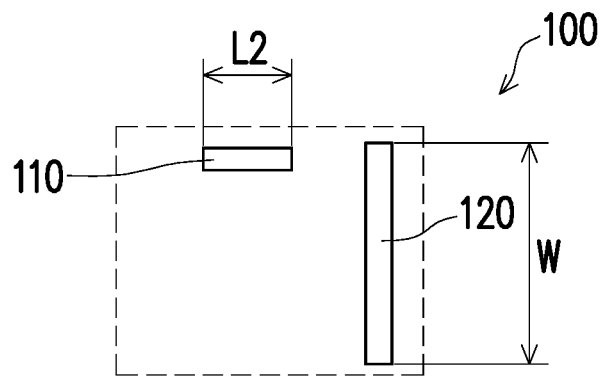
FIG. 4B is a schematic side view of the antenna module of FIG. 4A.

FIG. 4B is a schematic side view of the antenna module of FIG. 4A. Referring to FIG. 4B, in this embodiment, a width W of the second radiator 120 is between 2 mm and 3 mm, for example, 2.5 mm. A size (the width W) of the second radiator 120 in vertical direction of FIG. 4B is larger than a size (a thickness) of the first radiator 110 in vertical direction of FIG. 4B.

In addition, projection of the first radiator 110 onto a plane where the second radiator 120 is located is within the second radiator 120, and has a good coupling effect. In this embodiment, projection of the first radiator 110 and the second radiator 120 onto a plane where the first radiator 110 is located is L-shaped. In other words, the plane where the first radiator 110 is located is beside a top end of the second radiator 120.

Of course, in other embodiments, the projection of the first radiator 110 and the second radiator 120 on the plane where the first radiator 110 is located may also be T-shaped, that is, the plane where the first radiator 110 is located is between the top end and a bottom end of the second radiator 120. Relationship between the first radiator 110 and the second radiator 120 in a side view direction is not limited thereto.

Figure 5:
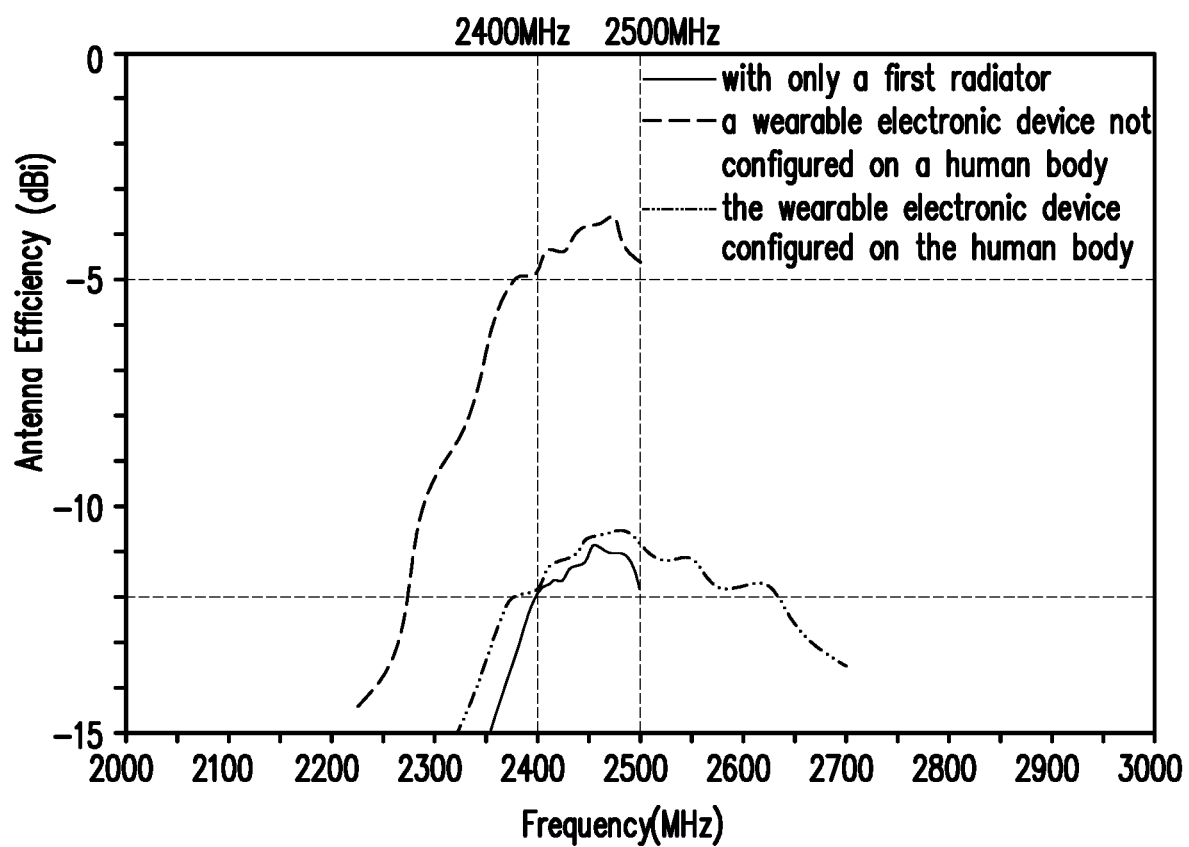
FIG. 5 shows frequency-antenna efficiency relationship for three states with only the first radiator, the wearable electronic device of FIG. 1 not configured on a human body, and the wearable electronic device of FIG. 1 configured on the human body.

FIG. 5 shows frequency-antenna efficiency relationship for three states with only the first radiator, the wearable electronic device of FIG. 1 not configured on the human body, and the wearable electronic device of FIG. 1 configured on the human body. Referring to FIG. 5, an antenna with only the first radiator 110 has the antenna performance in the first frequency band of −11 dBi to −12 dBi, which is less than −8 dBi, and does not meet a standard when the antenna is not configured on the human body.

The antenna module 100 of the wearable electronic device 10 of FIG. 1 (with the second radiator 120 configured next to the first radiator 110) has good performance when the wearable electronic device 10 is not configured on the human body, and the antenna performance thereof in the first frequency band may be increased to −3.6 dBi to −4.8 dBi, and is higher than −8 dBi.

In addition, when the wearable electronic device 10 of FIG. 1 is configured on the body, the antenna efficiency may remain between −10 dBi and −12 dBi, which is only about 6 dBi to 7 dBi less than when the wearable electronic device 10 is not configured on the human body, and is still higher than −14 dBi (the standard when the antenna is configured on the human body), and has good performance.

Figure 6:
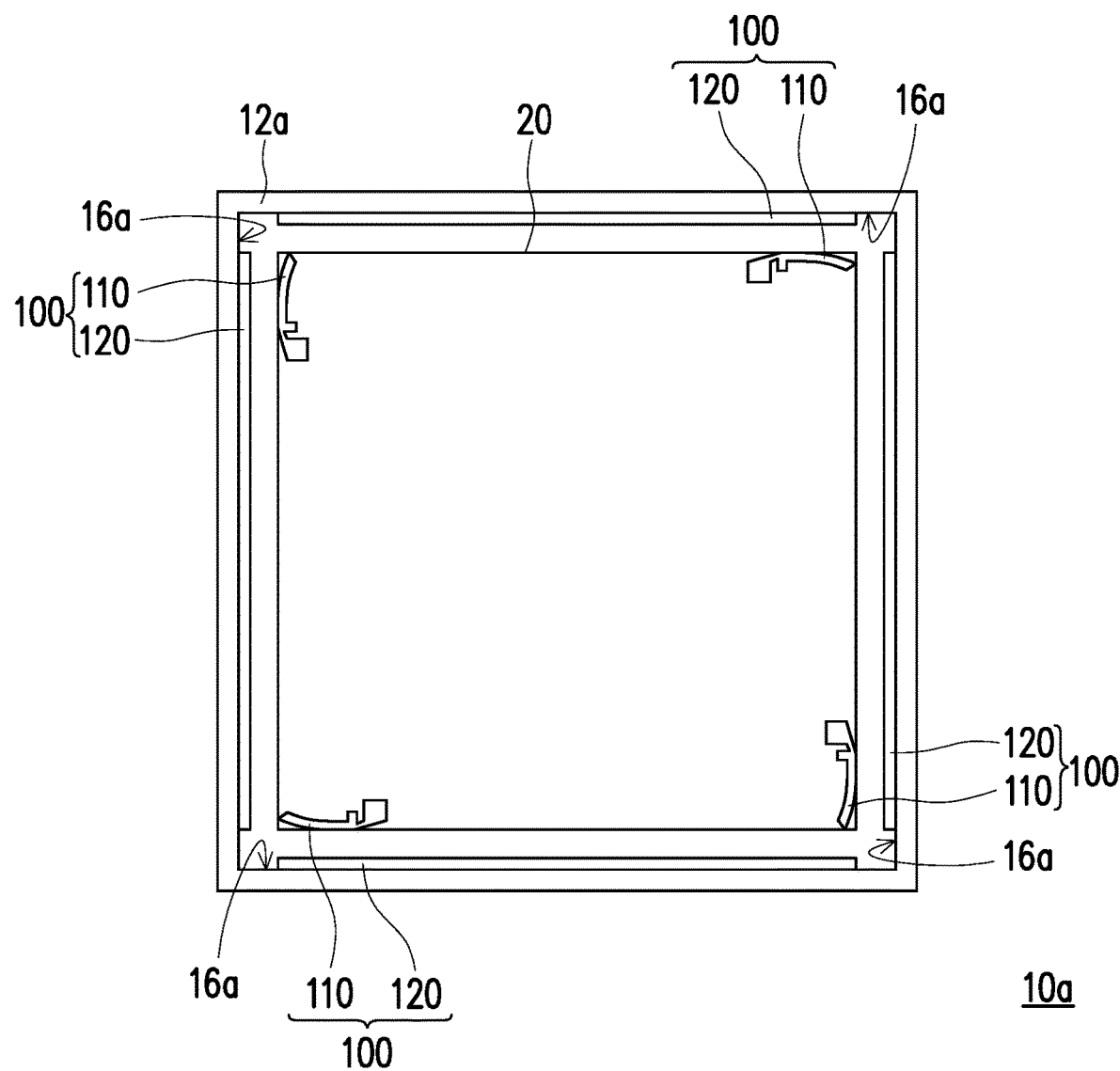
FIG. 6 is a schematic top view of a wearable electronic device according to another embodiment of the disclosure.

It should be noted that the antenna module 100 may be applied to small wearable electronic devices or other wireless communication devices. FIG. 6 is a schematic top view of a wearable electronic device according to another embodiment of the disclosure. Referring to FIG. 6, in this embodiment, multiple antenna modules 100 may be configured in the wearable electronic device, and a number of the antenna module 100 is, for example, four. The antenna module 100 may support 4×4 MIMO multi-antenna technology in existing 5G technologies in sub 6 GHz frequency band (for example, 5 GHz to 6 GHz).

In this embodiment, a casing 12a is rectangular in shape, the circuit board 20 includes multiple corners (for example, four), the first radiator 110 of each of the antenna module 100 is disposed at one of the corners of the circuit board 20, and the second radiator 120 of the each of the antenna module 100 is disposed on an inner side wall 16a corresponding to a position of the first radiator 110.

Since four first radiators 110 of the four antenna modules 100 are respectively disposed at the four corners of the circuit board 20 and are close to four corners of the casing 12a, a distance therebetween is maximized to reduce interference between the four antenna modules 100. In addition, the above design helps support MIMO transmission. Furthermore, in this embodiment, the antenna modules 100 are arranged equidistant or equiangular from each other, but are not limited thereto.

In this embodiment, due to operating in a higher frequency band (from 2.4 GHz to 5 GHz), a size of the antenna module 100 may be correspondingly reduced, and multiple (for example, four) antenna modules 100 may be configured in a small-sized electronic device, and these antenna modules 100 do not interfere with each other. A length and a width of the casing 12a may be 34.6 mm, but are not limited thereto.

In summary, the first radiator of the antenna module of the disclosure includes the first section, the second section and the third section extending from the first section in opposite directions respectively. The first section includes the feeding end, and the third section includes the grounding end. The second radiator is vertically configured on one side of the first radiator, and the coupling gap is formed between the second radiator and the first radiator. Through the above configuration, the antenna module of the disclosure enables the first radiator and the second radiator to jointly resonate at the first frequency band and the second frequency band, and has a good antenna efficiency performance. In addition, the electronic device of the disclosure provides a dual band function by disposing the first radiator on the circuit board and near an edge of the circuit board, and the second radiator on the inner side wall of the casing, and configuring the antenna module in a limited space.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising:
    a casing having an accommodating space and an inner side wall surrounding the accommodating space;
    a circuit board disposed in the accommodating space; and
    at least one antenna module, wherein each of the antenna modules comprises:
        a first radiator disposed on the circuit board and adjacent to the inner side wall, wherein the first radiator comprises a first section, a second section and a third section, the second section and the third section extend from the first section in opposite directions respectively, the first section comprises a feeding end, and the third section comprises a grounding end; and
        a second radiator disposed on the inner side wall and configured at one side of the first radiator, and a coupling gap formed between the first radiator and the first radiator, wherein the first radiator and the second radiator jointly resonate at a first frequency band and a second frequency band.

2. The electronic device according to claim 1, wherein projection of the first radiator onto a plane where the second radiator is located is within the second radiator, and projection of the first radiator and the second radiator onto a plane where the first radiator is located is L-shaped or T-shaped.

3. The electronic device according to claim 1, wherein a length of the second radiator is between ¼ wavelength and ⅜ wavelength of the first frequency band.

4. The electronic device according to claim 1, wherein a width of the second radiator is between 2 mm and 3 mm.

5. The electronic device according to claim 1, wherein the coupling gap is between 0.5 mm and 1.5 mm.

6. The electronic device according to claim 1, wherein the third section has a first part and a second part connected by bending, the first part is connected to the second section, and the second part is parallel to the first section.

7. The electronic device according to claim 1 further comprising a capacitor, wherein the feeding end is connected to a system ground plane through the capacitor.

8. The electronic device according to claim 1, wherein the first frequency band is between 2400 MHz and 2500 MHz, and the second frequency band is between 3300 MHz and 3600 MHz.

9. The electronic device according to claim 1, wherein a number of the at least one antenna module is plural, the circuit board comprises a plurality of corners, the first radiator of the each of the antenna modules is disposed at a corresponding corner, and the second radiator of the each of the antenna modules is disposed at a position on the inner side wall corresponding to the first radiator.

10. The electronic device according to claim 9, wherein the antenna modules are arranged equidistant or equiangular from each other.

* * * * *